United States Patent
Nakamura et al.

(10) Patent No.: US 6,331,891 B1
(45) Date of Patent: Dec. 18, 2001

(54) APPARATUS AND METHOD FOR ASSEMBLING SEMICONDUCTOR DEVICE AND SEMICONDUCTOR DEVICE THUS FABRICATED

(75) Inventors: Yutaka Nakamura; Tetsuo Koezuka; Hitoshi Komoriya; Takao Hirahara, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/285,675

(22) Filed: Apr. 5, 1999

Related U.S. Application Data

(63) Continuation-in-part of application No. 09/161,487, filed on Sep. 28, 1998, now abandoned.

(30) Foreign Application Priority Data

Apr. 7, 1998 (JP) .................................................. 10-94951

(51) Int. Cl.[7] .................................................. G01B 11/00
(52) U.S. Cl. ............................................ 356/401; 356/400
(58) Field of Search .................................... 356/399–401; 200/548; 438/14, 16

(56) References Cited

U.S. PATENT DOCUMENTS

| | | | |
|---|---|---|---|
| 3,903,363 | * 9/1975 | Monotone et al. | 356/399 |
| 4,840,876 | * 6/1989 | Arai | 430/328 |
| 5,539,752 | * 7/1996 | Berezin et al. | 364/490 |
| 5,550,634 | * 8/1996 | Nakamura | 356/401 |
| 6,133,986 | * 10/2000 | Johnson | 355/67 |

* cited by examiner

*Primary Examiner*—F L Evans
*Assistant Examiner*—Zandra Smith
(74) *Attorney, Agent, or Firm*—Armstrong, Westerman, Hattori, McLeland & Naughton, LLP

(57) ABSTRACT

An apparatus for assembling a semiconductor device including a stage having a substrate support surface for supporting a substrate, and a support member for carrying a semiconductor element to a position on or near the substrate supported by the stage. A microscope unit having a coaxial illuminating unit is arranged inclined to the substrate support surface of the stage, and a counter illuminating unit is arranged inclined on the opposite side from the microscope unit with respect to a normal to the substrate support surface of the stage. A camera is arranged at an image forming position of the microscope unit 1 and an image processing unit is connected to the camera. The substrate has a positioning mark, and the camera acquires an image of the positioning mark and an image of a reflection of the positioning mark reflected by the side surface of the semiconductor element.

9 Claims, 13 Drawing Sheets

APPARATUS AND METHOD FOR ASSEMBLING SEMICONDUCTOR DEVICE AND SEMICONDUCTOR DEVICE THUS FABRICATED

CROSS REFERENCE TO RELATED APPLICATION

This application is a continuation-in-part application of Ser. No. 09/161,487 now abandoned filed on Sep. 28, 1998.

BACKGROUND OF THE INVENTION

1. Field of the Invention

The present invention relates to an apparatus and method of assembling a semiconductor device and positioning and fixing a semiconductor element to a substrate. The present invention also relates to a semiconductor device fabricated by such a method and apparatus.

2. Description of the Related Art

Many semiconductor devices have been designed in which a semiconductor element such as a photodiode or a laser diode is fixed to a substrate. To obtain such a semiconductor device, it is necessary to position and fix the semiconductor element at a certain position relative to the substrate. In the conventional method of assembling a semiconductor device, positioning marks are provided in the substrate, the semiconductor element is moved onto the substrate, and the semiconductor element is positioned relative to the substrate by moving semiconductor element in such a manner that the bottom of a side of the semiconductor element is overlaid on the positioning marks.

Such a conventional method, however, has the drawback that, when the semiconductor element comes near to a target position, the positioning marks are hidden by the semiconductor element and cannot be seen, so it is difficult to achieve the positioning of the semiconductor element with good accuracy in a short time. If the positioning mark is displaced to a position in front of the target position of the semiconductor element, the positioning mark can be easily seen but the positioning of the semiconductor element cannot be accurately attained.

Moreover, the bottom surface of the semiconductor element is not always in intimate contact with the surface of the substrate, and it is necessary to perform the positioning of the semiconductor element in a state where there is a gap between the bottom surface of the semiconductor element and the surface of the substrate. Thus, when the positioning of the semiconductor element is performed while observing the semiconductor element and the substrate, both the bottom surface of the semiconductor element and the surface of the substrate are not in focus, so it is difficult to position the semiconductor element by simultaneously observing both the substrate and the semiconductor element. Furthermore, it is difficult to quickly move the semiconductor element to a target position, so it is not possible to automatically position the semiconductor elements.

SUMMARY OF THE INVENTION

The object of the present invention is to provide an apparatus and method, for assembling a semiconductor device, by which a semiconductor element can be reliably and quickly positioned relative to a substrate.

An apparatus for assembling a semiconductor device, according to the present invention, comprises: a stage having a substrate support surface for supporting a substrate; a support member for carrying a semiconductor element to a position on or near the substrate supported by the stage; a microscope unit arranged inclined to the substrate support surface of the stage and having a coaxial illuminating unit; a counter illuminating unit arranged on the opposite side from the microscope unit with respect to a normal to the substrate support surface of the stage and inclined to the substrate support surface thereof; a camera arranged at an image forming position of the microscope unit; and an image processing unit connected to the camera.

With this constitution, it is possible to acquire an image of a positioning mark provided on the substrate and an image of a reflection of the positioning mark reflected by a side surface of a semiconductor element, to calculate the positional relationship between the semiconductor element and the substrate, and to accurately and quickly position the semiconductor element relative to the substrate.

Preferably, the stage has a heater, so that the semiconductor element can be soldered to the substrate.

Preferably, the substrate has at least one positioning mark. Further, the camera is adapted to acquire an image of at least one positioning mark and an image of a reflection of at least one positioning mark reflected by a side surface of the semiconductor element, to thereby obtain the positional relationship between the image of at least one positioning mark and the image of the reflection of at least one positioning mark. The positioning of the semiconductor element onto the substrate is performed according to the positional relationship obtained in this manner.

Preferably, the apparatus for assembling a semiconductor element further comprises: calculating means for calculating a positional relationship between the substrate and the semiconductor element from the positional relationship between the image of at least one positioning mark and the image of the reflection thereof; and moving means for moving at least one of the stage and the support member according to the calculating means.

Preferably, at least one positioning mark has a circular shape. Alternatively, at least one positioning mark has a specific shape formed in the substrate. Alternatively, at least one positioning mark is formed from a material which is different in reflectance from a material of the aforesaid substrate.

Preferably, the at least one positioning mark comprises two positioning marks. Further, the substrate has a linear structure which is different from the at least one positioning mark.

Moreover, a method for assembling a semiconductor element, according to the present invention, comprises the steps of: acquiring an image of at least one positioning mark formed on a substrate, which is supported on a stage, and an image of a reflection of at least one positioning mark reflected by a side surface of the semiconductor element arranged on or near the substrate; obtaining a positional relationship between the image of at least one positioning mark and the image of the reflection of at least one positioning mark; and positioning the semiconductor element relative to the substrate according to the positional relationship therebetween.

In this case too, the positioning of a semiconductor element relative to a substrate can be accurately and quickly achieved by obtaining an image of a positioning mark provided on the substrate and an image of a reflection of the positioning mark reflected by a side surface of a semiconductor element, and then calculating the positional relationship between the semiconductor element and the substrate.

Preferably, the step of acquiring the image of at least one positioning mark formed on the substrate comprises acquiring the image by a camera through a microscope unit, while slantingly irradiating the substrate with illuminating light from a counter illuminating unit arranged inclined to the substrate support surface of the stage, the microscope unit being arranged on the opposite side of the counter illuminating unit with respect to a normal to the substrate support surface of the stage and inclined to a substrate support surface of the stage.

Preferably, the step of acquiring an image of at least one positioning mark and an image of the reflection of at least one positioning mark reflected by a side surface of the semiconductor element, comprises a step of acquiring the images by a camera through a microscope unit, while slantingly irradiating the substrate with illuminating light from a coaxial illuminating unit provided in the microscope unit.

Preferably, the method further comprises the step of calculating a positional relationship between the substrate and the semiconductor element from the positional relationship between the image of at least one positioning mark and the image of the reflection of at least one positioning mark, and moving at least one of the stage and the support member supporting the semiconductor element, according the result of the calculation. Preferably, the method further comprises the step of computing a distance between the substrate and the semiconductor element and an angle of rotation of the semiconductor element with respect to the substrate from at least one positioning mark and the reflection image.

Preferably, the step of acquiring the image of at least one positioning mark and the image of the reflection thereof comprises the steps of: acquiring the images of two positioning marks and the images of reflections thereof; and calculating a distance between the substrate and the semiconductor element, an angle of rotation of the substrate, and an angle of rotation of the semiconductor element with respect to the substrate, which is based on an angle between a straight line, which passes through the two positioning marks formed on the substrate, and a straight line, which passes through reflections of the two positioning marks, from the two positioning marks and reflections thereof. Preferably, the method further comprises the steps of: adjusting a position of the semiconductor element in a direction parallel to a side thereof according to at least one mark provided on the semiconductor element and to a position of at least the one positioning mark provided thereon.

Preferably, the substrate has a linear structure, which is different from the one positioning mark, and a position of the semiconductor element is adjusted by preliminarily checking a positional relationship between the one positioning mark and the linear structure and then adjusting the position of the semiconductor element according to the positional relationship therebetween when at least one positioning mark is hidden by the semiconductor element when the semiconductor element is placed at a target position.

The present invention also provides a semiconductor device comprising a substrate having a surface; a semiconductor element mounted to the surface of the substrate, the semiconductor element having a side surface; and the substrate having at least one positioning mark in a mark setting area contiguous to the side surface of the semiconductor element, whereby the at least one positioning mark and an image of a reflection of the at least one positioning mark reflected by the side surface of the semiconductor element can be observed.

The semiconductor device can be conveniently fabricated by the above described method and apparatus. The semiconductor device includes an optical semiconductor device in which the semiconductor element comprises a semiconductor chip such as a photo diode or a laser diode, for example.

Preferably, the at least one positioning mark is arranged in such a relationship with the semiconductor element that the at least one positioning mark does not overlap the semiconductor element and is away from the side surface of the semiconductor element.

Preferably, the at least one positioning mark has a circular shape. Alternatively, the at least one positioning mark has a specific shape formed on the substrate, or the at least one positioning mark is formed from a material which is different in reflectance from a material of the substrate.

Preferably, the at least one positioning mark comprises two positioning marks. In this case, the two positioning marks are preferably circular positioning marks located on a line substantially parallel to the side surface of the semiconductor element mounted to the substrate.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
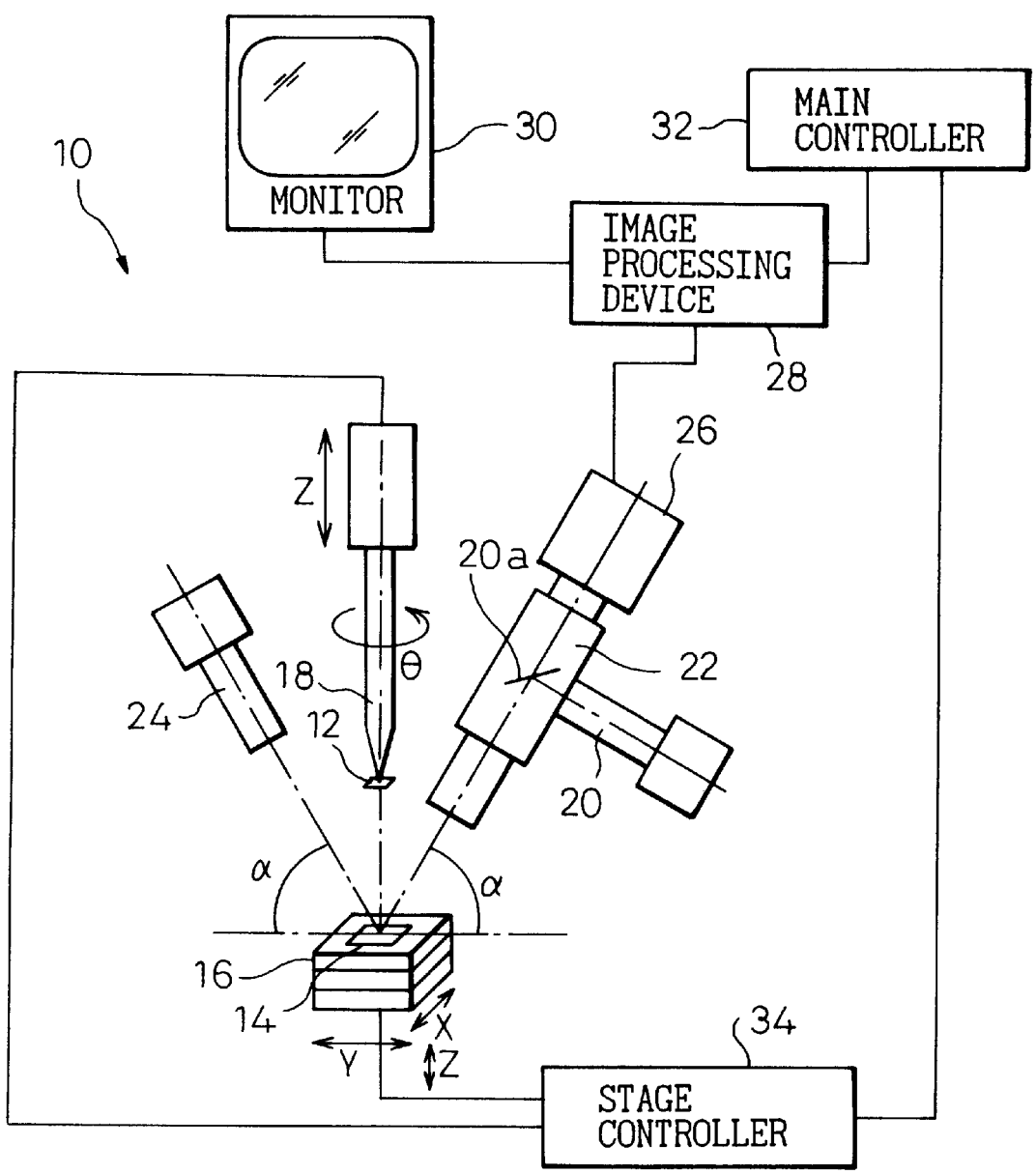
FIG. 1 is a view illustrating an apparatus of assembling a semiconductor device according to the first embodiment of the present invention.

FIG. 1 shows an apparatus of assembling a semiconductor device according to the present invention. The apparatus 10 is operative to form a semiconductor device by attaching a semiconductor element 12 to a substrate 14. The semiconductor element 12 is a semiconductor chip such as a photodiode or a laser diode, for example, and the substrate 14 is a silicon substrate, for instance.

The apparatus 10 is provided with a stage 16 onto which the substrate 14 is placed, and a support member 18 for carrying the semiconductor element 12 onto the substrate 14 supported by the stage 16. The stage 16 is adapted to move in the X, Y and Z axes and has a heater (not shown) therein, so that the semiconductor element 12 can be soldered to the substrate 14 by inserting solder between the semiconductor element 12 and the substrate 14. The support member 18 comprises an arm 19 and is movable in the direction of the Z-axis and rotatable in the direction of an angle θ around the Z-axis. Further, the support member 18 has an attracting means, which is operative to attract the semiconductor element 12, at the tip end portion thereof.

The apparatus 10 is further provided with a microscope unit 22 having a coaxial illuminating unit 20, a counter illuminating unit 24, a CCD camera 26 placed at an image forming position of the microscope unit 22, and an image processing unit 28 connected to the CCD camera 26. Moreover, a monitor 30, a main controller 32 and a stage controller 34 are provided in the fabrication apparatus 10. The main controller 32 is operative to control the entire apparatus. The stage controller 34 controls the movement of the stage 16 and the support member 18.

The microscope unit 22 having the coaxial illuminating unit 20 is arranged inclined to the substrate support surface of the stage 16, and the counter illuminating unit 24 is arranged inclined on the opposite side of the microscope unit 22 with respect to a normal N to the substrate support surface of the stage 16 and inclined to the substrate support surface thereof. The microscope unit 22 is arranged at an angle α of elevation to the substrate support surface of the stage 16. The counter illuminating unit 24 is arranged on the side opposite to the microscope unit 22 and at an angle α of elevation to the substrate support surface of the stage 16. The coaxial illuminating unit 20 contains a semitransparent mirror 20a placed in the barrel of the microscope unit 22.

Figure 2:
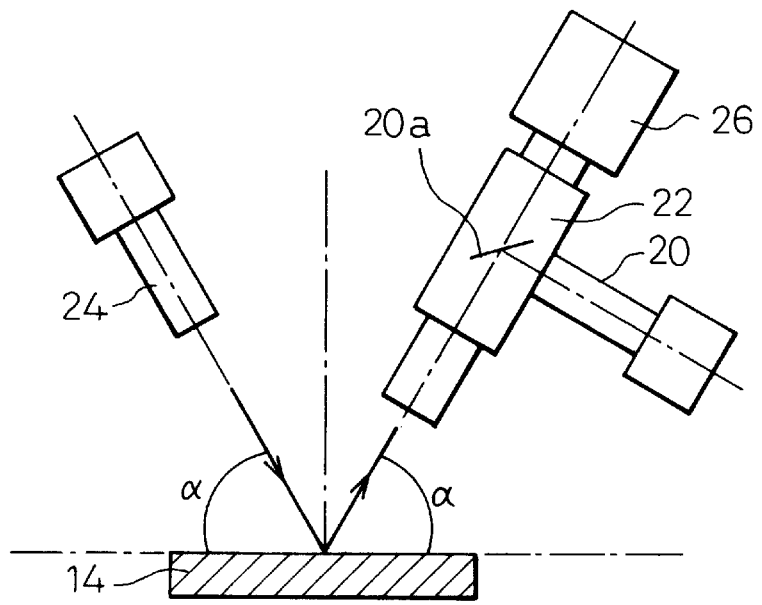
FIG. 2 is a view illustrating the case where the counter illuminating unit is used when no semiconductor element is present on the substrate.

FIG. 2 illustrates a case where the counter illuminating unit 24 is used when the semiconductor element 12 is not present on the substrate 14. Illuminating light emitted from the counter illuminating unit 24 is regularly reflected by the surface of the substrate 14 of the stage 16 and is then made incident to the microscope unit 22. The illuminating light then passes through the semitransparent mirror 20a and travels toward the CCD camera 26. Image obtained by the CCD camera 26 is processed by the image processing unit 28.

Figure 3:
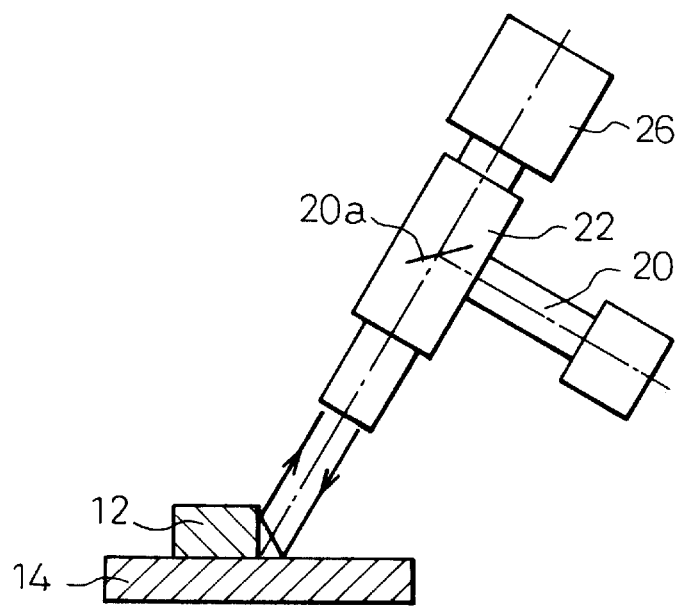
FIG. 3 is a view illustrating a case where the coaxial illuminating unit is used when a semiconductor element is present on the substrate.

FIG. 3 illustrates a case that the coaxial illuminating unit 20 is used when the semiconductor element 12 is present on the substrate 14. Illuminating light emitted from the coaxial illuminating unit 20 is reflected by the semitransparent mirror 20a and then travels in the barrel of the microscope unit 22 toward the substrate 14 supported by the stage 16. The illuminating light is reflected by the surface of the substrate 14 supported by the stage 16 and by a side surface of the semiconductor element 12 and is made incident to the microscope unit 22. The light passes through the semitransparent mirror 20a and then goes to the CCD camera 26. The image obtained by the CCD camera 26 is processed by the image processing unit 28.

Figure 4:
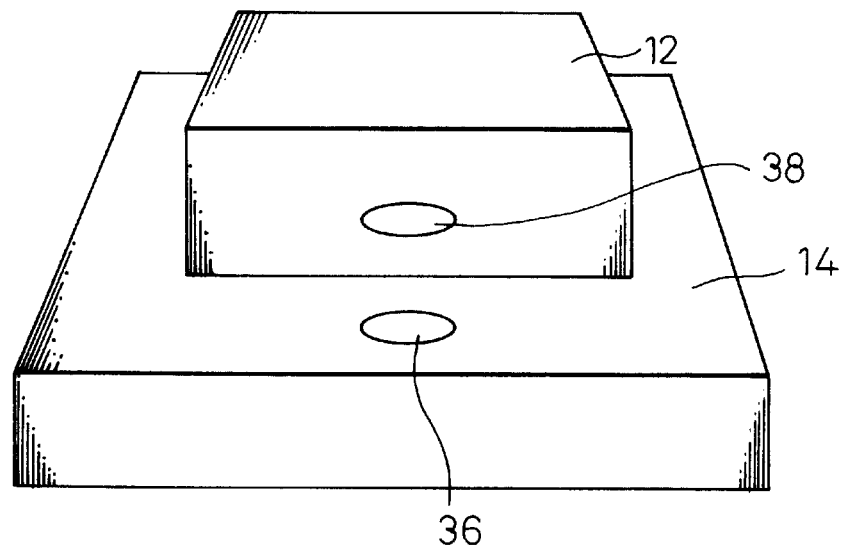
FIG. 4 is a view illustrating an example of the substrate provided with a positioning mark.
Figure 5:
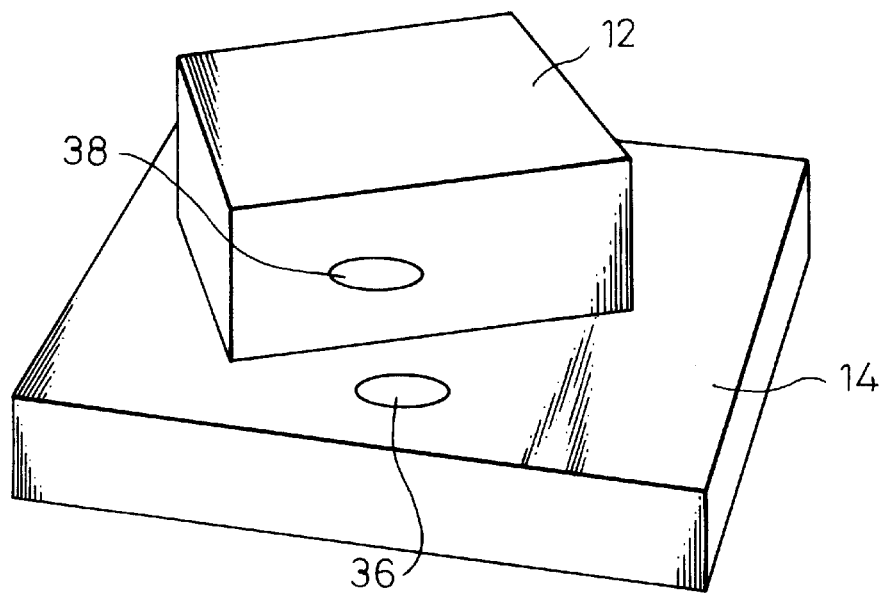
FIG. 5 is a view illustrating an example of a case where the semiconductor element is placed on the substrate inclined to a side of the substrate.

FIG. 4 illustrates an example of the substrate 14 having a positioning mark 36. When the substrate 14 and the semiconductor element 12 are viewed in a slanting direction, the positioning mark 36 and a reflection (image) 38 of the positioning mark 36, which is reflected by a side surface of the semiconductor element 12, are observed. Namely, the reflection 38 of the positioning mark 36 is formed on the side surface of the semiconductor element 12 since the cleavage plane of the crystal of the semiconductor element 12 acts as a mirror. FIG. 5 illustrates a case where the semiconductor element 12 is placed on the substrate 14 in such a way as to be inclined at an angle to the substrate 14.

In a fabricating operation, the substrate 14 is put on the stage 16 and then the positioning of the substrate 14 thereon is performed. In this case, the positioning of the substrate 14 is performed while the semiconductor element 12 is not present on or near the substrate 14 as illustrated in FIG. 2, by observing the surface of the substrate 14 by the microscope unit 22, using the counter illuminating unit 24, and obtaining the image of the positioning mark 36 on the substrate 14, using the CCD camera 26.

The support member 18 is then operated to move the semiconductor element 12 onto the substrate 14. The coaxial illuminating unit 20 is used this time, as illustrated in FIG. 3. The positioning mark on the surface of the substrate 14 and the reflection 38 of the positioning mark 36 on the side surface of the semiconductor element 12 are observed by the microscope unit 22 and an image 36a (see FIG. 8) of the positioning mark 36 and an image 38a (see FIG. 8) of the reflection 38 are obtained by the CCD camera 26.

Figure 6:
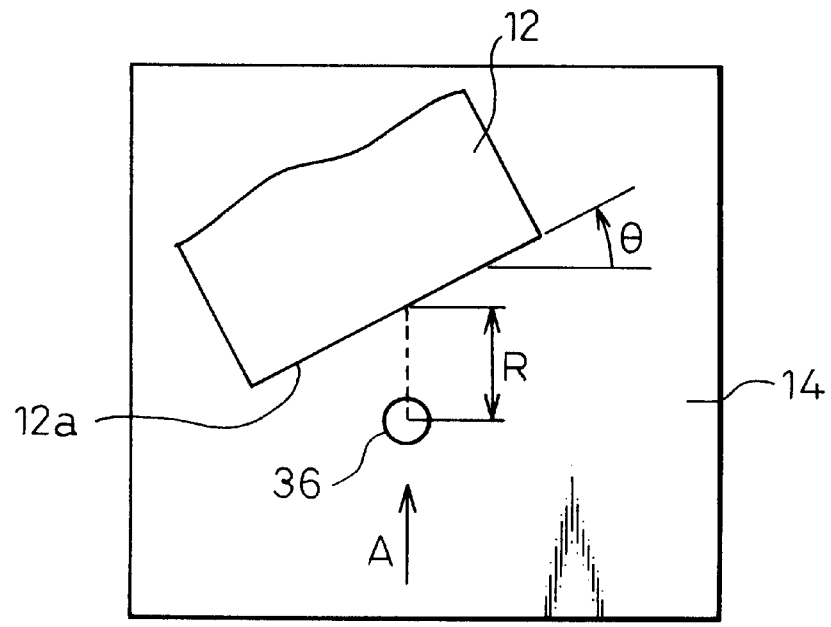
FIG. 6 is a plan view of the substrate and the semiconductor element.
Figure 7:
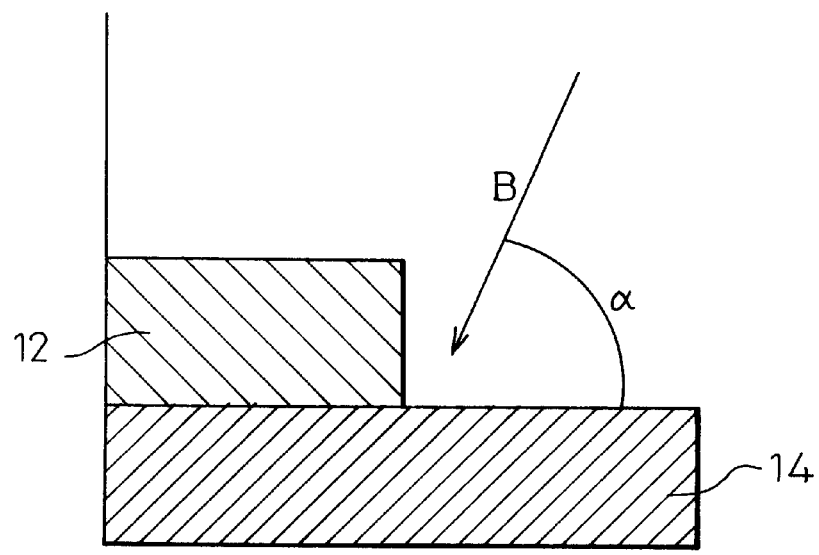
FIG. 7 is a side view, in cross-section, of the substrate and the semiconductor element.

FIG. 6 is a plan view of the substrate 14 and the semiconductor element 12. FIG. 7 is a side cross-sectional view of the substrate 14 and the semiconductor element 12. Incidentally, the direction A indicates a direction in which the substrate 14 is seen from the front thereof. In this case, it is assumed that the angle θ is formed between the substrate 14 and the side surface 12a of the semiconductor 12 and that the distance in the direction A between the positioning mark 36 and the side surface 12a of the semiconductor element 12 is R.

Figure 8:
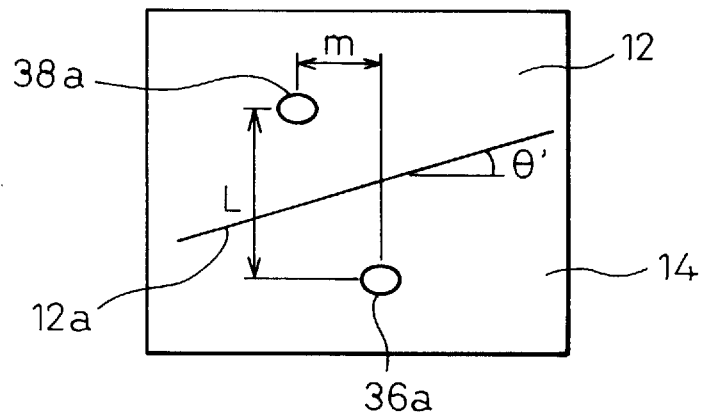
FIG. 8 is a view illustrating an image of the positioning mark and an image of a reflection thereof, which are obtained by the image processing unit.
Figure 9:
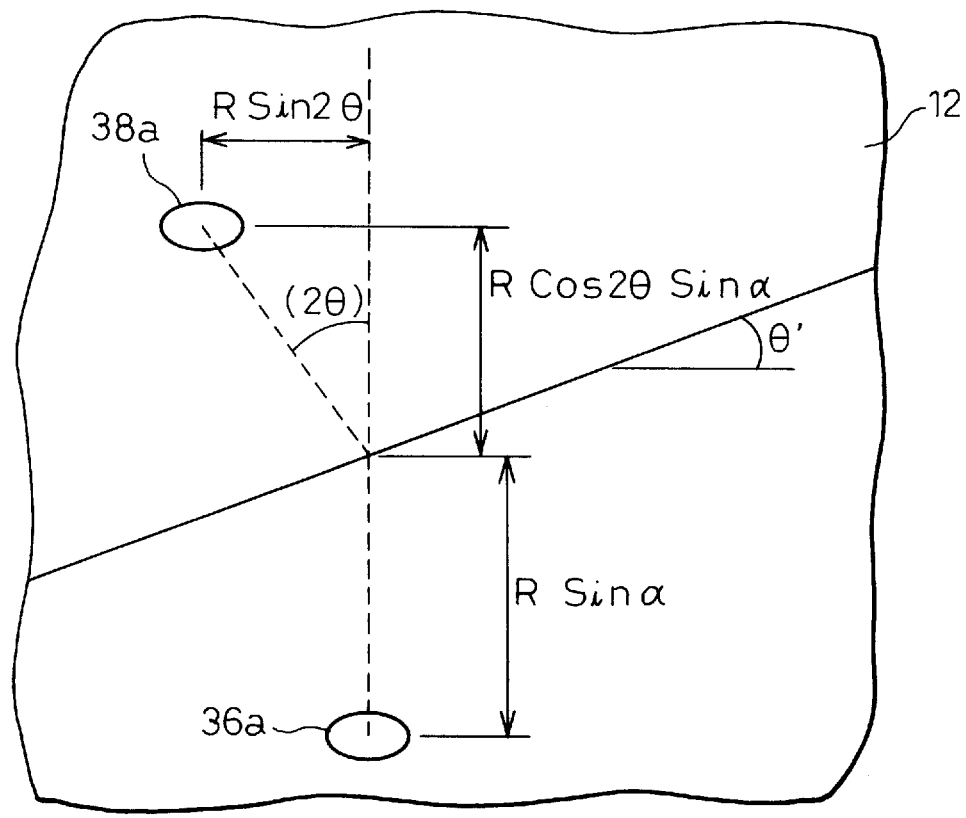
FIG. 9 is an enlarged view of a part of FIG. 8.

FIGS. 8 and 9 are views of the substrate 14 and the semiconductor element 12 that are seen from an upwardly slanting direction. Namely, FIGS. 8 and 9 show the image 36a of the positioning mark 36 and the image 38a of the reflection 38, which are obtained by the image processing unit 28 (and thus displayed on the screen of the monitor 30) in the case where the microscope unit 22 is placed in the direction A of FIG. 6 and in the direction of FIG. 7. The distance "m" between the image 36a of the positioning mark 36 and the image 38a of the reflection 38 in the direction of the X-axis and the distance "L" therebetween in the direction of the Y-axis can be obtained directly from these images displayed on the screen. Further, the angle θ' formed between the substrate 14 and the side surface 12a of the semiconductor element 12 can be also obtained directly from the image displayed on the screen. There are the following relationship among the distances "m" and "L" and the angle θ', which are illustrated in FIGS. 8 and 9, and the distance "R" and the angle θ that are illustrated in FIG. 6.

$$m = R \sin 2\theta \quad (1)$$

$$L = R(1+\cos 2\theta)\sin \alpha \quad (2)$$

$$\theta' = \arctan(\sin \theta \sin \alpha / \cos \theta) \quad (3)$$

These equations are solved for R and θ as follows:

$$R = (L + m^2 \sin^2 \alpha / L)(2 \sin \alpha) \quad (4)$$

$$\theta = \arctan(m \sin \alpha / L) \quad (5)$$

These relationships are stored in the main controller 32. Thus, R and θ can be immediately obtained by obtaining m, L and θ' by image processing. Therefore, it is possible to position the semiconductor element 12 as desired by moving or adjusting the semiconductor element 12 in the direction A of FIG. 6 by a predetermined distance with respect to the substrate 14 and by turning it by an angle θ. Incidentally, the aforementioned calculation is an example of the positioning of the semiconductor element in the XY-plane to be performed when the semiconductor element 12 is in contact with the substrate 14.

Figure 11:
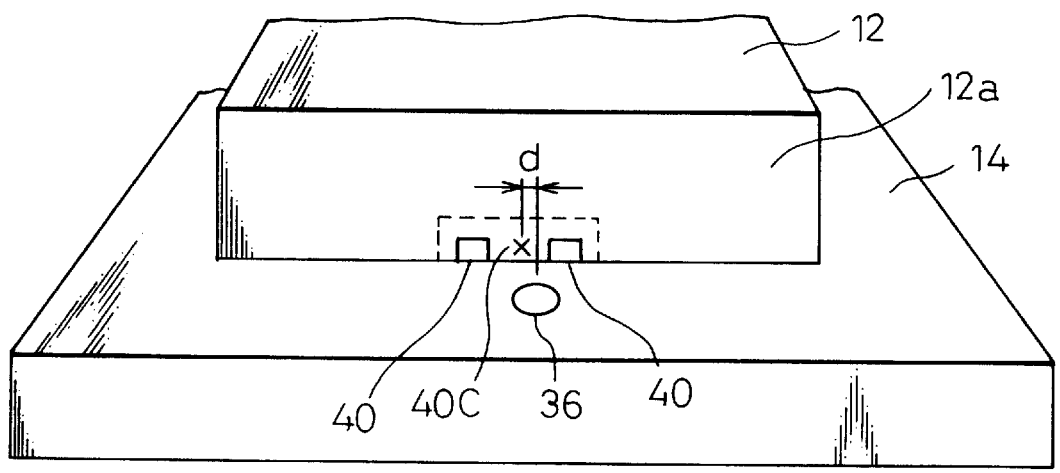
FIG. 11 is a view illustrating an example of a case where two marks respectively constituted by concave parts are provided in a side portion of the substrate.

In the case where it is necessary to perform the positioning of the semiconductor element 12 in the direction perpendicular to the direction A, suitable marks should be provided on the side surface 12a of the semiconductor element 12. For instance, FIG. 11 shows an example in which two marks 40 respectively constituted by concave portions are provided in the side surface (portion) 12a of the semiconductor element 12. The positioning of the semiconductor element 12 in the direction perpendicular to the direction A can be achieved by obtaining the distance "d" from the midpoint 40c between the two marks 40 to the positioning mark 36. Further, the positioning of the semiconductor element 12 in the XY-plane can be performed with the semiconductor element 12 placed above the substrate 14 at a slight gap between the semiconductor element 12 and the substrate 14.

Upon completion of the positioning of the semiconductor element 12 relative to the substrate 14, the heater provided in the stage 16 is operated to solder the semiconductor element 12 to the substrate 14. The solder may be preliminarily provided on the surface of the substrate 14, or alternatively, the solder may be filled into a space between the semiconductor element 12 and the substrate 14.

Figure 10:
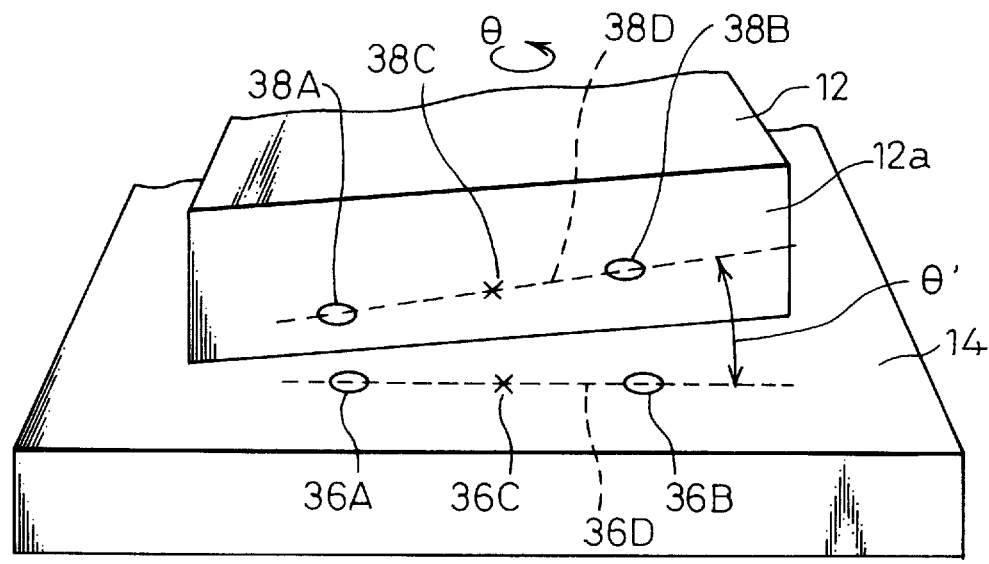
FIG. 10 is a view illustrating an example of a case where two positioning marks are arranged on the substrate.

FIG. 10 shows an example in which two positioning marks 38A and 38B are provided on the substrate 14. The reflection images 38A and 38B of the two positioning marks 36A and 36B are formed or seen in the side surface 12a of the semiconductor element 12. In this example, the midpoint 36C between the positioning marks 36A and 36B, the straight line 36D passing through the positioning marks 36A and 36B, the midpoint 38C between the reflection images 38A and 38B, the straight line 38D passing through the reflection images 38A and 38B can be obtained. The angle θ' of rotation can be obtained from the relationship between the straight lines 36D and 38D. The distance between the semiconductor element 12 and the positioning mark can be obtained from the distance between the midpoints 36C and 38C.

Figure 12:
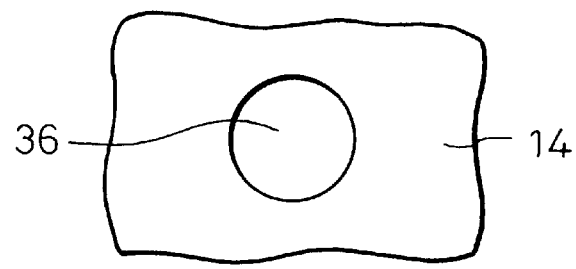
FIG. 12 is a plan view showing the shape of the positioning mark arranged on the substrate.

It is preferable that the positioning mark 36 formed on the substrate 14 has a circular shape, as shown in FIG. 12. As a result of making the positioning mark 36 a circle, the observed positioning mark 36 has a same shape, regardless of the angle of rotation of the semiconductor element 12 and the substrate 14. Thus, the recognition of the positioning mark is facilitated.

Figure 13:
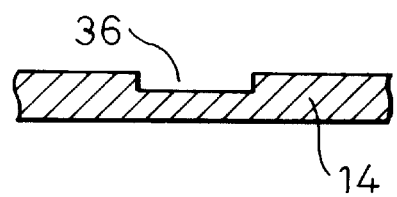
FIG. 13 is a cross-sectional view illustrating the shape of the positioning mark arranged on the substrate.

It is preferable that the positioning mark 36 of the substrate 14 is formed in the substrate 14 in a specific shape, as illustrated in FIG. 13. In the example of FIG. 13, the positioning mark is formed in a circular concave shape. Such a positioning mark can be reliably and easily formed by etching the substrate 14. Incidentally, the positioning mark can be formed in a convex shape.

Figure 14:
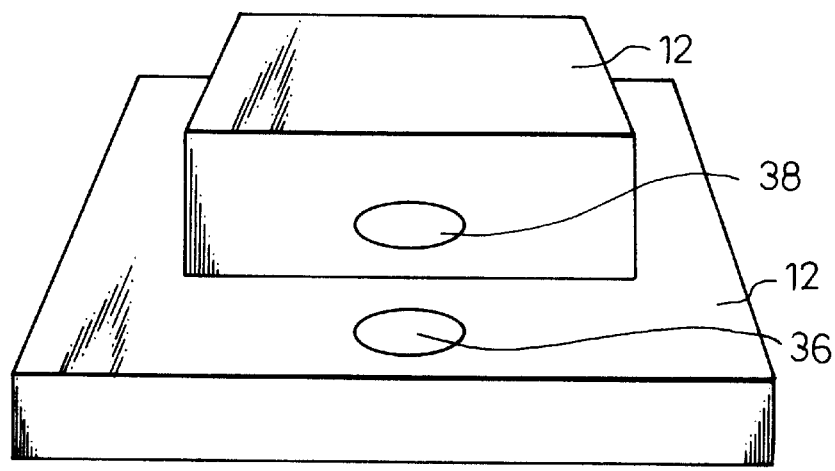
FIG. 14 is a perspective view illustrating another shape of the positioning mark arranged on the substrate.

FIG. 14 shows another example of the positioning mark 36. In this case, the positioning mark 36 is formed from a material or shape, which is different in reflectance from a material or shape of the substrate 14. Namely, the positioning mark 36 is formed from a material or shape, whose reflectance is higher or lower than that of the substrate 14. Thus, the image of the positioning mark has high contrast, so that the recognition of the positioning mark is facilitated.

FIGS. 15A to 20 show another embodiment of the present invention. In this embodiment too, the semiconductor manufacturing apparatus of FIG. 1 is used. This embodiment is advantageous in a case where the positioning mark 36 is formed on the substrate 14 at such a position that the mark 36 is hidden by the semiconductor element 12. The substrate 14 has a linear structure 42 that is different from the circular positioning mark 36. In this embodiment, the linear structure 42 is formed by utilizing a boundary between surface structures on the substrate 14.

Figure 15A:
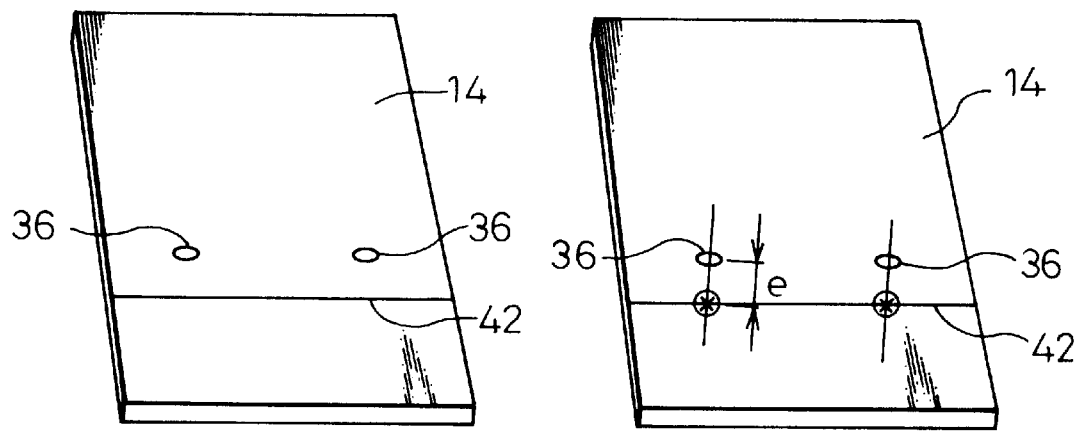
FIGS. 15A to 15C are views illustrating a method of fabricating a semiconductor device according to the second embodiment of the present invention.
Figure 15B:
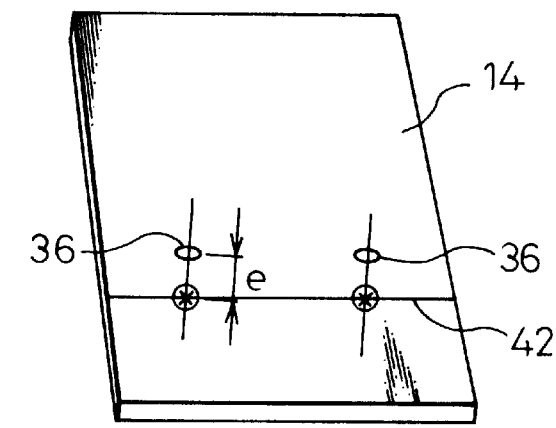
Figure 15C:
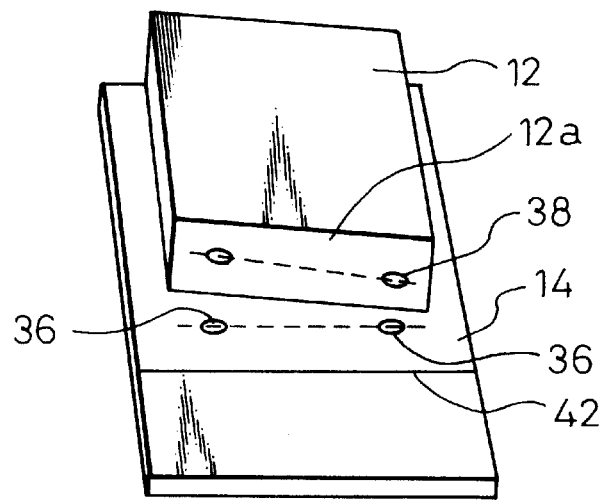

When fabricating a semiconductor device, the circular positioning marks 36 formed on the substrate 14 are recognized, as illustrated in FIG. 15A. Moreover, the linear structure 42 provided on the substrate 14 is recognized as illustrated in FIG. 15B. Then, the distance "e" between the circular positioning mark 36 and the linear structure 42 is obtained. Next, the semiconductor element 12 is put on the substrate 14, as illustrated in FIG. 15C. The semiconductor element 12 is temporarily positioned at a position where the circular positioning marks 36 can be seen, according to the relationship between the image of the circular positioning mark 36 and the reflection image thereof, in a similar manner to the foregoing case. At this time, the rotation of the semiconductor element 12 is corrected.

Figure 16A:
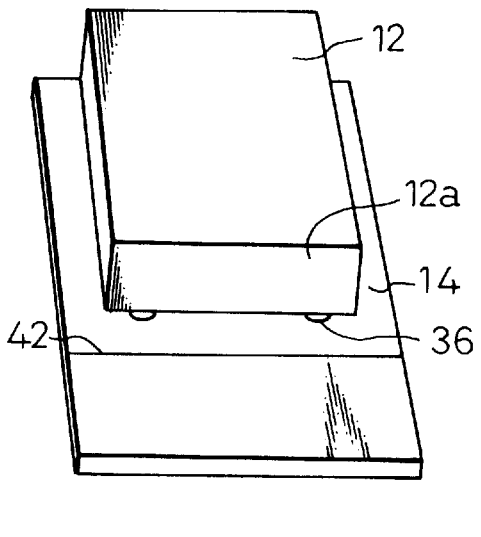
FIGS. 16A to 16C are views illustrating the steps following the steps of FIG. 15C.
Figure 16B:
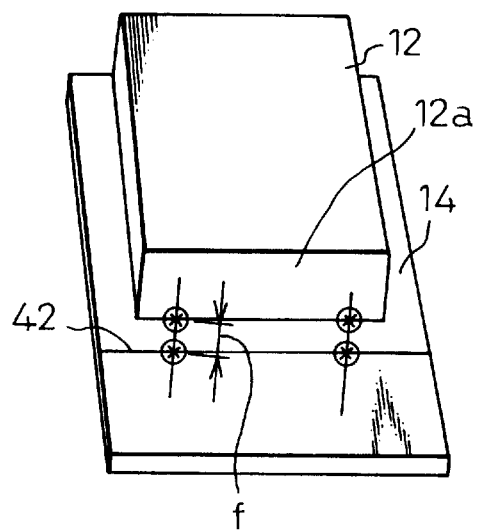
Figure 16C:
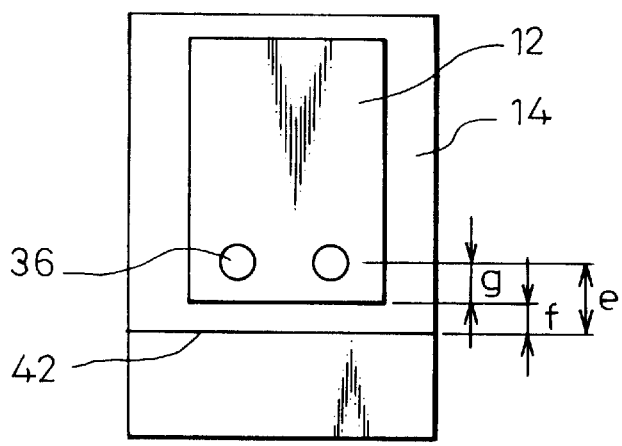

Further, the semiconductor element 12 is moved to a position which is almost a target position, as illustrated in FIG. 16A. At that time, the circular positioning marks 36 are hidden by the semiconductor element 12. Subsequently, the distance "f" between the side surface 12a of the semiconductor element 12 and the linear structure 42, as illustrated in FIG. 16B. Next, the semiconductor element 12 is further moved by a distance g=e−f, as illustrated in FIG. 16C.

In this fabrication method, even when the circular positioning marks 36 are hidden by the semiconductor element 12, the positioning or justification of the semiconductor element 12 can be checked by measuring data representing the positional relationship between each circular positioning mark 36 and the linear structure 42 before the circular positioning marks 36 are hidden and by then adjusting the position of the semiconductor element 12 with respect to this linear structure 42. Further, the recognition of the linear structure 42 is performed for every substrate, so that highly accurate positioning of the semiconductor element can be attained regardless of the shape of the linear structure 42.

FIGS. 17 through 20 show examples of methods of recognizing the position of the linear structure 42.

Figure 17:
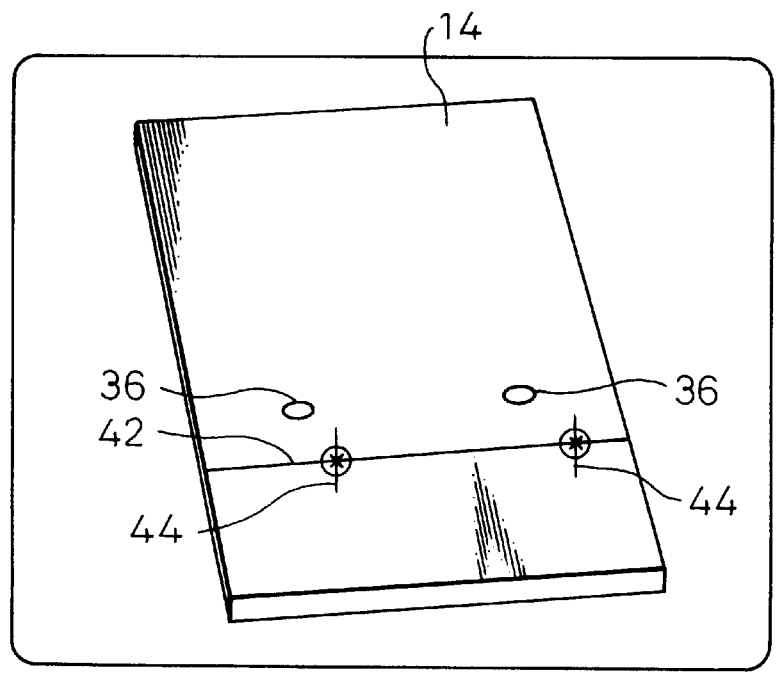
FIG. 17 is a view illustrating an example of a method of recognizing the position of a linear structure.

In FIG. 17, the point of intersection between the linear structure 42 and the straight line 44 fixed on the screen is recognized.

Figure 18:
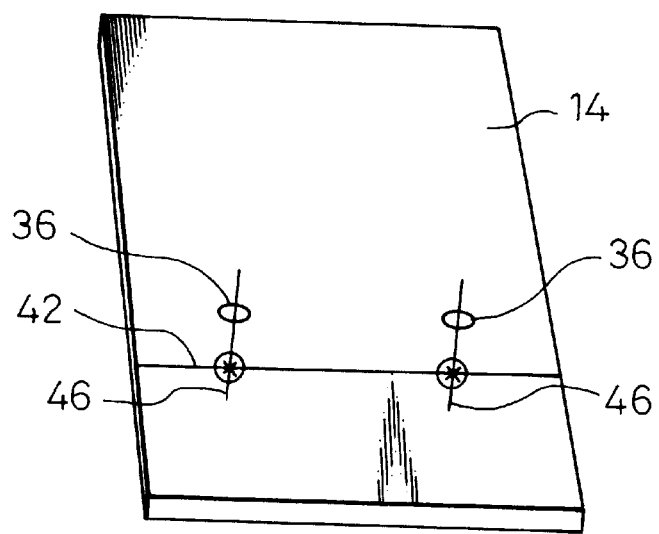
FIG. 18 is a view illustrating another example of the method of recognizing the position of a linear structure.

In FIG. 18, the point of intersection between the linear structure 42 and the straight line 46 passing through the center of the circular positioning mark 36 is recognized.

Figure 19:
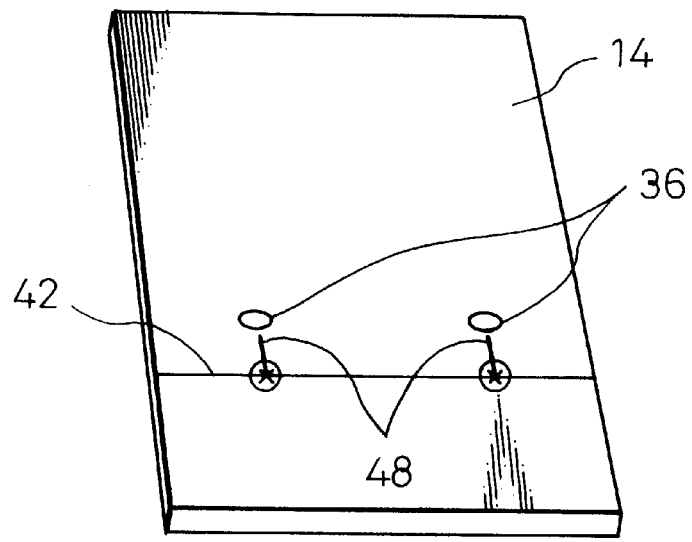
FIG. 19 is a view illustrating still another example of the method of recognizing the position of a linear structure.

In FIG. 19, linear recognizing marks 48 are formed at positions where the linear recognizing marks 48 intersect with the linear structure 42, respectively. Thus, the point of intersection between the linear structure 42 and the linear recognizing mark 48 is recognized.

Figure 20:
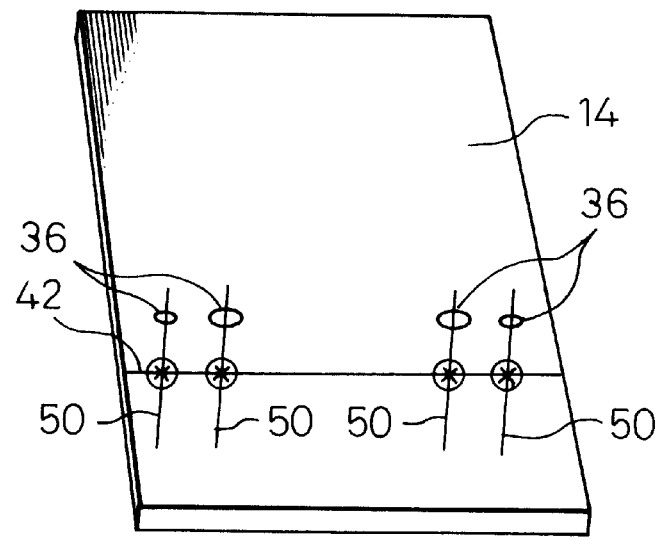
FIG. 20 is a view illustrating yet another example of the method of recognizing the position of a linear structure.

In FIG. 20, a plurality of recognizing marks 50, which are different in shape and position from one another, are formed. Further, the relative position between the linear structure 42 and each of the marks 50 is recognized. Furthermore, the recognized relative positions are averaged.

Figure 21:
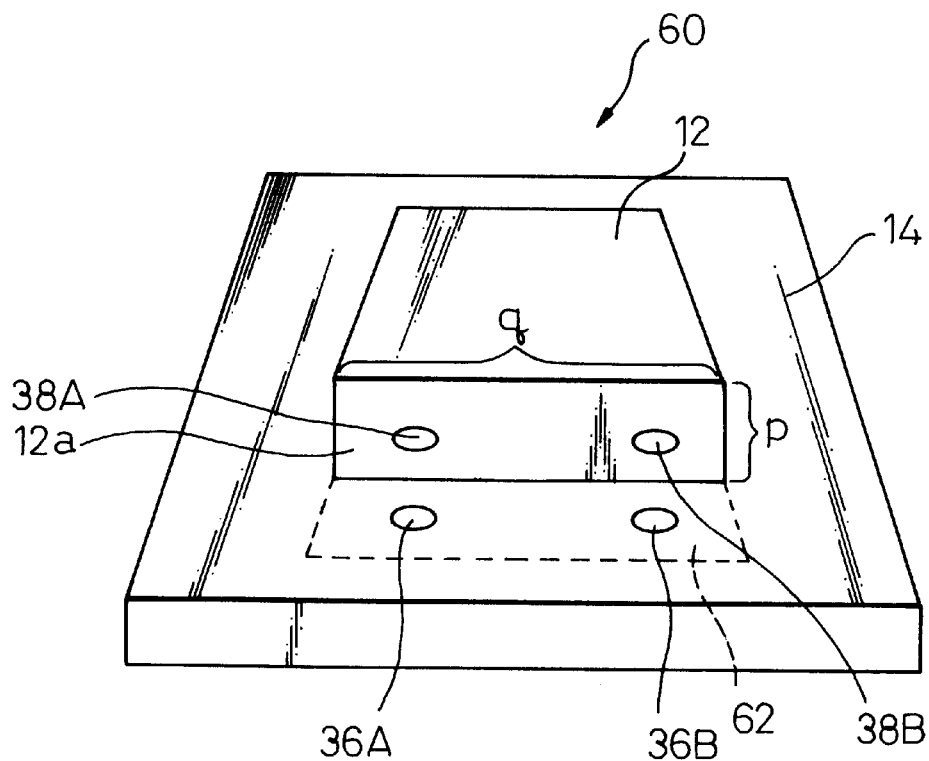
FIG. 21 is a perspective view of a semiconductor device fabricated by a method and an apparatus according to the present invention.
Figure 22:
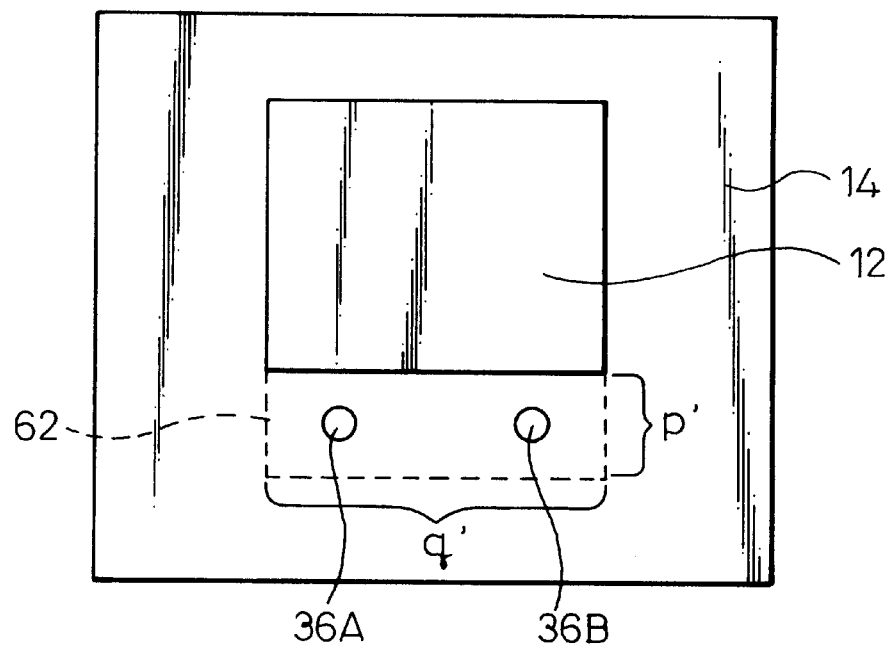
FIG. 22 is a plan view of the semiconductor device of FIG. 21.
Figure 23:
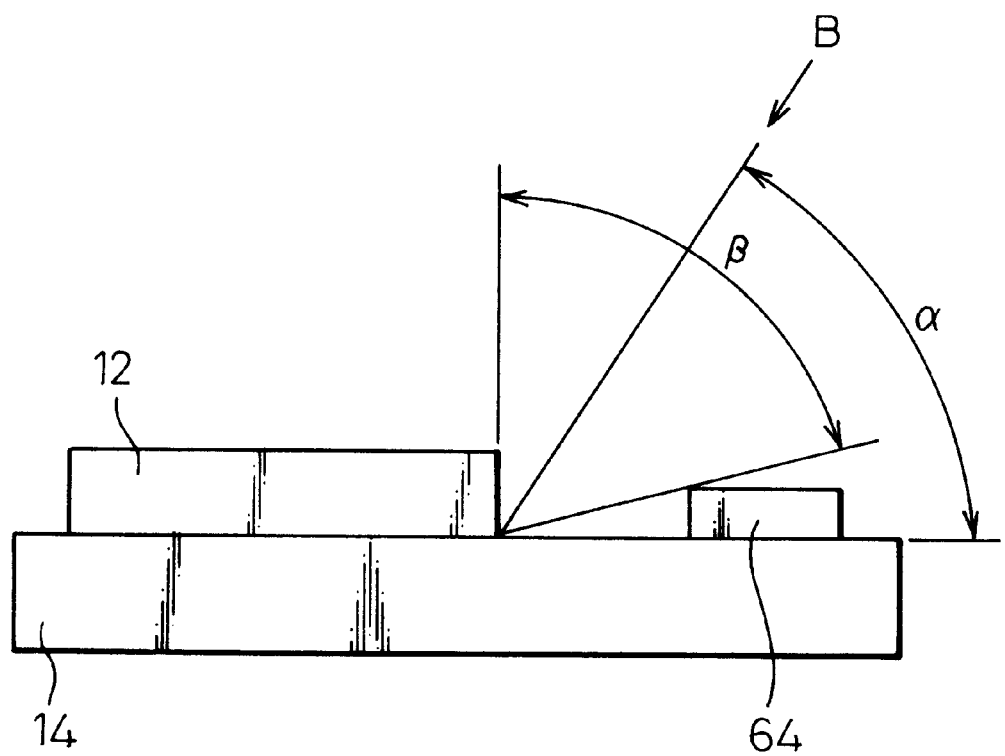
FIG. 23 is a side view of the semiconductor device.

FIG. 21 is a perspective view of a semiconductor device 60 fabricated by the above described method and apparatus according to the present invention. FIG. 22 is a plan view of the semiconductor device 60 of FIG. 21, and FIG. 23 is a side view of the semiconductor device 60. The semiconductor device 60 comprises a substrate 14 and a semiconductor element 12 mounted to the surface of the substrate. The substrate 14 has at least one positioning mark.

In FIGS. 21 and 22, the at least one positioning mark comprises two circular positioning marks 36A and 36B. This semiconductor device 60 corresponds to the final form of the semiconductor device shown in FIG. 10. In the final form of the semiconductor device 60, two circular positioning marks 36A and 36B are located on a line substantially parallel to the side surface 12a of the semiconductor element 12 mounted on the substrate 14.

The at least one positioning mark of the semiconductor device 60 can be one positioning mark 36, as shown in FIGS. 4 to 9. The at least one positioning mark can be a positioning mark 36 having a specific shape formed on the substrate 14, as described with reference to FIG. 13. Also, the at least one positioning mark can be a positioning mark 36 formed from a material which is different in reflectance from a material of the substrate 14, as described with reference to FIG. 14.

The at least one positioning mark 36 (36A and 36B) is provided in a mark setting area 62 on the surface of the substrate 14 contiguous to the side surface 12a of the semiconductor element 12. The mark setting area 62 is defined so that the at least one positioning mark 36 (36A and 36B) and an image of a reflection of the at least one positioning mark 36 (36A and 36B) reflected by the side surface 12a of the semiconductor element 12 can be simultaneously observed. In this case, the at least one positioning mark 36 (36A and 36B) is arranged in such a relationship with the semiconductor element 12 that the at least one positioning mark 36 (36A and 36B) does not overlap with the semiconductor element 12 and is apart from the side surface 12a of the semiconductor element 12. That is, in the principle of the method of assembling the semiconductor device according to the present invention, the distance "R" between the at least one positioning mark 36 (36A and 36B) and the side surface 12a of the semiconductor element 12 is calculated, and positioning of the semiconductor element 12 is carried out based on the calculated distance "R", as described with reference to FIG. 6.

The mark setting area 62 is defined by the area of p'×q', where "p" is the height of the side surface 12a of the semiconductor element 12, and "q" is the width of the side surface 12a of the semiconductor element 12. Here, p'=p/tan α, q'=q. α is the angle of observation. In FIG. 23, the arrow B indicates the direction of observation, and the angle of observation α is an angle between the surface of the substrate and the direction of observation B. The angle of observation α can be any angle in the range from zero to 90 degrees. When the substrate 14 includes an uneven surface structure 64, the direction of observation B is restricted in the angular range β, so that the angle of observation α becomes narrower.

As described above, in accordance with the present invention, the high-precision adjusting and positioning of semiconductor elements onto a substrate can be achieved in a short time. Further, a mark for adjusting is formed on the substrate and there is no necessity for providing a marking area in a small semiconductor element. Consequently, a load imposed on the semiconductor element is light. Moreover, even when the mark is hidden, an adjustment position can be checked. A semiconductor device including a substrate and a semiconductor chip mounted thereto can thus be conveniently obtained.

What is claimed is:

1. An apparatus for assembling a semiconductor device, comprising:

a stage having a substrate support surface for supporting a substrate;

a support member for carrying a semiconductor element to a position on or near the substrate supported by said stage;

a microscope unit arranged inclined to the substrate support surface of said stage and having a coaxial illuminating unit, the microscope unit being inclined so that the microscope unit can observe an end surface or side surface of the semiconductor element rested on the substrate when said coaxial unit is used;

a counter illuminating unit arranged on the opposite side from said microscope unit with respect to a normal to the substrate support surface of said stage and inclined to the substrate support surface thereof;

a camera arranged at an image forming position of said microscope unit; and an image processing unit connected to said camera.

2. The apparatus for assembling a semiconductor device according to claim 1, wherein said stage has a heater, so that said semiconductor element can be soldered to said substrate.

3. An apparatus for assembling a semiconductor device, comprising:

a stage having a substrate support surface for supporting a substrate;

a support member for carrying a semiconductor element to a position on or near the substrate supported by said stage;

a microscope unit arranged inclined to the substrate support surface of said stage and having a coaxial illuminating unit;

a counter illuminating unit arranged on the opposite side from said microscope unit with respect to a normal to the substrate support surface of said stage and inclined to the substrate support surface thereof;

a camera arranged at an image forming position of said microscope unit; and an image processing unit connected to said camera, wherein said substrate has at least one positioning mark, wherein said camera is adapted to acquire an image of said at least one positioning mark and an image of a reflection of said at least one positioning mark reflected by a side surface of said semiconductor element, to thereby obtain a positional relationship between the image of said at least one positioning mark and the image of the reflection of said at least one positioning mark, and positioning of said semiconductor element onto said substrate is performed according to the positional relationship therebetween.

4. The apparatus for assembling a semiconductor device according to claim 3, further comprising:

calculating means for calculating a positional relationship between the substrate and the semiconductor element from the positional relationship between the image of said at least one positioning mark and the image of the reflection thereof; and moving means for moving at least one of said stage and said support member according to said calculating means.

5. The apparatus for assembling a semiconductor device according to claim 3, wherein said at least one positioning mark has a circular shape.

6. The apparatus for assembling a semiconductor device according to claim 3, wherein said at least one positioning mark has a specific shape formed on said substrate.

7. The apparatus for assembling a semiconductor device according to claim 3, wherein said at least one positioning mark is formed from a material which is different in reflectance from a material of said substrate.

8. The apparatus for assembling a semiconductor device according to claim 3, wherein said at least one positioning mark comprises two positioning marks.

9. The apparatus for assembling a semiconductor device according to claim 3, wherein said substrate has a linear structure which is different from said at least one positioning mark.

* * * * *

UNITED STATES PATENT AND TRADEMARK OFFICE
CERTIFICATE OF CORRECTION

PATENT NO.    : 6,331,891 B1
DATED         : December 18, 2001
INVENTOR(S)   : Nakamura et al.

It is certified that error appears in the above-identified patent and that said Letters Patent is hereby corrected as shown below:

<u>Title page,</u>
Item [30], Foreign Application Priority Data, insert
-- Jan. 21, 1999 (JP)…….. 11-13299 --

Signed and Sealed this

Twenty-second Day of October, 2002

Attest:

Attesting Officer

JAMES E. ROGAN
Director of the United States Patent and Trademark Office